United States Patent
Kim et al.

(10) Patent No.: US 9,958,713 B2
(45) Date of Patent: May 1, 2018

(54) ARRAY SUBSTRATE AND DISPLAY DEVICE

(71) Applicant: BOE TECHNOLOGY GROUP CO., LTD., Beijing (CN)

(72) Inventors: Ki Man Kim, Beijing (CN); Jaegeon You, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days. days.

(21) Appl. No.: 14/428,119

(22) PCT Filed: Jun. 26, 2014

(86) PCT No.: PCT/CN2014/080900
§ 371 (c)(1),
(2) Date: Mar. 13, 2015

(87) PCT Pub. No.: WO2015/100981
PCT Pub. Date: Jul. 9, 2015

(65) Prior Publication Data
US 2015/0301365 A1 Oct. 22, 2015

(30) Foreign Application Priority Data
Dec. 30, 2013 (CN) .......................... 2013 1 0745888

(51) Int. Cl.
G02F 1/1333 (2006.01)
H01L 33/42 (2010.01)
G02F 1/1335 (2006.01)

(52) U.S. Cl.
CPC ...... *G02F 1/1333* (2013.01); *G02F 1/133502* (2013.01); *H01L 33/42* (2013.01); *G02F 2001/133565* (2013.01)

(58) Field of Classification Search
CPC ... G02F 1/1333; G02F 1/133502; H01L 33/42
(Continued)

(56) References Cited

U.S. PATENT DOCUMENTS 5,866,975 A * 2/1999 Gartner ................... H01J 1/304
313/270
2007/0188689 A1 8/2007 Nakamura
(Continued)

FOREIGN PATENT DOCUMENTS

CN 101017269 A 8/2007
CN 102646726 A 8/2012
(Continued)

OTHER PUBLICATIONS

International Search Report with Notice of Transmittal of the International Search Report of PCT/CN2014/080900 in Chinese, dated Sep. 30, 2014.
Written Opinion of the International Searching Authority of PCT/CN2014/080900 in Chinese with English translation dated Sep. 30, 2014.
Chinese Office Action of Chinese Application No. 201310745888.7, dated Oct. 10, 2015 with English translation.
(Continued)

*Primary Examiner* — Lucy Chien
(74) *Attorney, Agent, or Firm* — Collard & Roe, P.C.

(57) ABSTRACT

An array substrate and a display device are disclosed. A coating layer (8) is disposed between a base substrate (1) and a first transparent conductive oxide film layer (2), a refractive index of the coating layer (8) is bigger than that of the base substrate (1) and smaller than that of the first transparent conductive oxide film layer (2). A multi-layer reflection phenomenon caused by the relatively big difference between the refractive indexes of the base substrate 1 and the first transparent conductive oxide film layer 2 can be weakened, thereby the light transmission rate of the array substrate may be improved.

19 Claims, 4 Drawing Sheets

(58) Field of Classification Search
USPC .......................................................... 349/158
See application file for complete search history.

(56) References Cited

U.S. PATENT DOCUMENTS

| | | | |
|---|---|---|---|
| 2009/0020321 A1* | 1/2009 | Schulz-Harder | ...... C04B 37/026 |
| | | | 174/256 |
| 2009/0188726 A1 | 7/2009 | Chang et al. | |
| 2012/0127578 A1* | 5/2012 | Bright | .................... G02B 1/116 |
| | | | 359/585 |
| 2014/0071552 A1 | 3/2014 | Uchiyama et al. | |
| 2014/0085729 A1 | 3/2014 | Uchiyama et al. | |
| 2014/0106150 A1* | 4/2014 | Decker | .................. C03C 17/34 |
| | | | 428/216 |

FOREIGN PATENT DOCUMENTS

| | | |
|---|---|---|
| CN | 102879948 A | 1/2013 |
| CN | 103713420 A | 4/2014 |
| JP | H05203926 A | 8/1993 |
| JP | H11167003 A | 6/1999 |
| WO | 2012/157706 A1 | 11/2012 |
| WO | 2012/157719 A1 | 11/2012 |

OTHER PUBLICATIONS

Second Chinese Office Action of Chinese Application No. 201310745888.7, dated Mar. 25, 2016 with English translation.
Third Chinese Office Action of Chinese Application No. 201310745888.7, dated Aug. 24, 2016 with English translation.

* cited by examiner

ARRAY SUBSTRATE AND DISPLAY DEVICE

CROSS REFERENCE TO RELATED APPLICATIONS

This application is the National Stage of PCT/CN2014/080900 filed on Jun. 26, 2014, which claims priority under 35 U.S.C. § 119 of Chinese Application No. 201310745888.7 filed on Dec. 30, 2013, the disclosure of which is incorporated by reference.

TECHNICAL FIELD

Embodiments of the present invention relate to an array substrate and a display device.

BACKGROUND

At present, a transparent conductive oxide layer has wide applications in the fields of display screen, electroluminescence device, touch screen, solar battery, and other photoelectric devices due to its characteristics such as wide band gap, high transmission rate in the visible spectrum, and low electrical resistivity. For example, it may be used for a pixel electrode or a common electrode in a display screen; or it may be used for a touch electrode and the like in a touch screen.

Here, two kinds of array substrate structures applied to liquid crystal display screens and illustrated by FIG. 1 and FIG. 2 are described as examples. FIG. 1 illustrates that a base substrate 1 is sequentially provided with a first transparent conductive oxide film layer 2, an insulating layer 3, an alignment layer 4, and a liquid crystal layer 5; FIG. 2 illustrates that a base substrate 1 is sequentially provided with a first transparent conductive oxide film layer 2, an insulating layer 3, a passivation layer 6, a second transparent conductive oxide film layer 7, an alignment layer 4, and a liquid crystal layer 5. In the above two kinds of array substrate structures, a refractive index of the base substrate 1 is 1.5, and the first transparent conductive oxide film layer 2 generally uses indium tin oxides with a refractive index of 1.92 or indium zinc oxides or indium gallium zinc oxides with a refractive index of 2.05.

SUMMARY

Embodiments of the present invention provide an array substrate and a display device, which are used to improve the light transmission rate of an array substrate.

At least one embodiment of the present invention provides an array substrate, comprising: a base substrate, a first transparent conductive film layer located on the base substrate, a coating layer disposed between the base substrate and the first transparent conductive oxide film layer. A refractive index of the coating layer is larger than that of the base substrate and smaller than that of the first transparent conductive film layer.

At least one embodiment of the present invention further provides a display device, comprising the abovementioned array substrate provided by an embodiment of the present invention.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
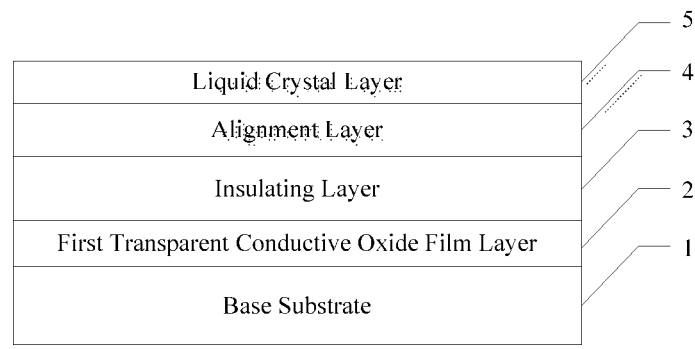
FIG. 1 and FIG. 2 separately are structural schematic diagrams of array substrates applied to liquid crystal display screens.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

In the drawings, the shape and the thickness of any film layer do not reflect a real scale of the film layer in an array substrate, and its purpose is only to schematically illustrate the content of the present invention.

Figure 2:
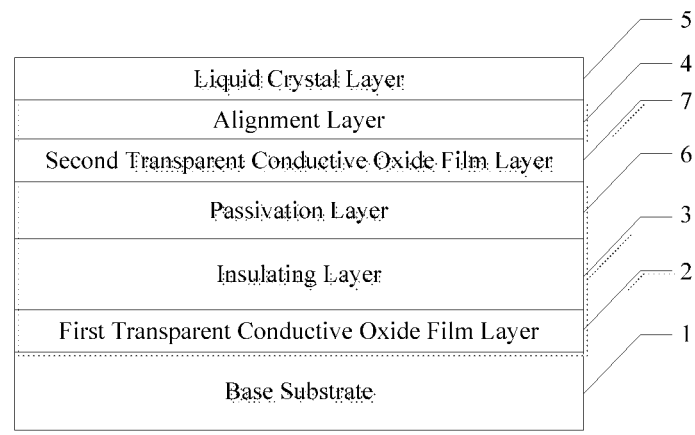

The inventors of the present application have noted that: in the structures illustrated by FIG. 1 and FIG. 2, because there is a relatively big difference between the refractive indexes of a base substrate 1 and a first transparent conductive oxide film layer 2, incident light suffers from a multilayer reflection phenomenon in a process that incident light enters from the base substrate 1 and emits from a liquid crystal layer 5; and the phenomenon leads to the decrease of light transmission rate of the entire array substrate. In an ideal state, when the thickness of the first transparent conductive oxide film layer 2 is 110-160 nm, the light transmission rate of the array substrate may become biggest. However, due to the limit of deposition time and etching precision, the thickness of the first transparent conductive oxide film layer 2 is generally controlled in a range of 30-50 nm in the practical manufacturing process, and it can be seen from experimental data that the light transmission rate of the array substrate manufactured in the ways is relatively low.

Figure 3:
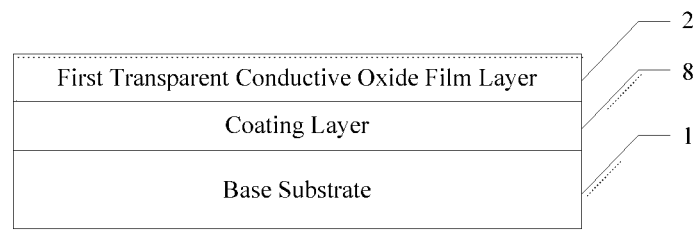
FIG. 3 is a structural schematic diagram of an array substrate provided by an embodiment of the present invention.

An embodiment of the present invention provides an array substrate, as illustrated by FIG. 3, comprising a base substrate 1 and a first transparent conductive film layer located on the base substrate 1, such as a first transparent conductive oxide film layer 2. Hereinafter, a first transparent conductive oxide film layer 2 is described as an example of the first transparent conductive film layer. A coating layer 8 is disposed between the base substrate 1 and the first transparent conductive oxide film layer 2, and a refractive index of the coating layer 8 is bigger than that of the base substrate 1 while smaller than that of the first transparent conductive oxide film layer 2. That is, the refractive index of the coating layer is between the refractive indexes of the base substrate 1 and the first transparent conductive oxide film layer 2.

In the abovementioned array substrate provided by an embodiment of the present invention, a coating layer 8 is added between the base substrate 1 and the first transparent conductive oxide film layer 2 which have a relatively big difference between the refractive indexes, and the refractive index of the coating layer 8 is bigger than that of the base substrate 1 and smaller than that of the first transparent conductive oxide film layer 2; so a multi-layer reflection phenomenon caused by the relatively big difference between the refractive indexes of the base substrate 1 and the first transparent conductive oxide film layer 2 can be weakened, thereby the light transmission rate of the array substrate can be improved.

It should be noted, in the abovementioned array substrate provided by at least one embodiment of the prevention, the first transparent conductive film layer may comprise a transparent conductive oxide or any other transparent conductive material. A material of the first transparent conductive oxide film layer 2 may be indium tin oxide, or may be iridium zinc oxide, indium gallium zinc oxide, or a combination of above any ones, which is not limited thereto. Further, in the abovementioned array substrate provided by an embodiment of the present invention, the first transparent conductive film layer 2 may be manufactured by using a magnetron sputtering method. Due to the limits to deposition time and etching precision, the thickness of the first transparent conductive oxide film layer 2 may be 30-50 nm. The following embodiments of the present invention are described by taking a case where the thickness of the first transparent conductive oxide film layer 2 is 40 nm as an example.

For example, because the refractive index of the base substrate 1 is 1.5, the refractive index of an indium tin film layer serving as a first transparent conductive oxide film layer 2 is 1.92, or the refractive index of the indium zinc oxide or indium zinc oxide film layer serving as a first transparent conductive oxide film layer 2 is 2.05, the refractive index of the newly added coating layer 8 may be selected between the refractive indexes of the base substrate 1 and the first transparent conductive oxide film layer 2, for example, the refractive index may be selected to be 1.6, 1.7, 1.8 or 1.9, which is not limited thereto.

For example, in the abovementioned array substrate provided by an embodiment of the present invention, in order to avoid the influence of the newly added coating layer 8 on the light transmission rate of the array substrate, the coating layer 8 may be selected as a material itself having a relatively small absorption and scattering to incident light, for example, one or a combination of any ones selected from a group consisting of silicon oxide, yttrium oxide, aluminum oxide, cerium fluoride, scandium oxide, etc., which is not limited thereto.

For example, in the abovementioned array substrate provided by an embodiment of the present invention, in consideration of the influence of the coating layer 8 on the light transmission rate of the array substrate, the thickness of the coating layer 8 may be bigger than or equal to 40 nm, and smaller than or equal to 160 nm; i.e. the thickness of the coating layer 8 is not smaller than 40 nm while not bigger than 160 nm.

Figure 4:
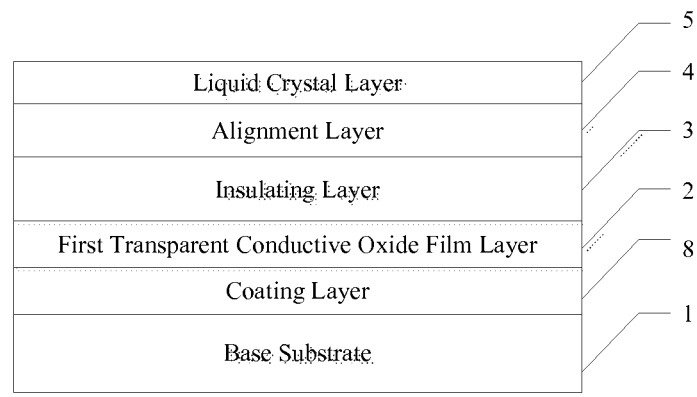
FIG. 4 and FIG. 5 separately are structural schematic diagrams of array substrates applied to liquid crystal display screens and provided by embodiments of the present invention.
Figure 5:
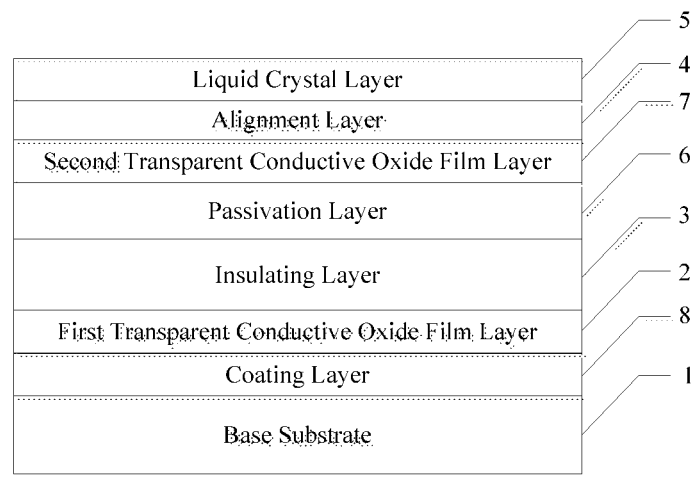

The above-mentioned array substrate provided by an embodiment of the present invention may be applied for a display screen, or may be applied for an electroluminescence light emitting device, a touch screen, a solar battery, and the other photoelectric device fields, which is not limited thereto. For example, when the above-mentioned array substrate provided by the present invention is applied to a liquid crystal display screen, the array substrate may be applied to a twisted nematic (TN) mode liquid crystal display screen, as illustrated by FIG. 4, the base substrate 1 is only provided with a first transparent conductive oxide film layer 2 used for a pixel electrode; the above-mentioned array substrate provided by an embodiment of the present invention may be applied to an advanced super dimension switch (ADS) mode liquid crystal display screen as well, as illustrated by FIG. 5, the base substrate 1 is provided with a first transparent conductive oxide film layer 2 used for a pixel electrode and a second transparent conductive film layer located on the first transparent conductive oxide film layer 2 and insulated from the first transparent conductive oxide film layer 2, for example, a second transparent conductive oxide film layer 7, the second transparent conductive film layer 7 may be used for a common electrode, which is not limited thereto.

It should be noted that, in the abovementioned array substrate provided by an embodiment of the present invention, the second transparent conductive oxide film layer 7 is described as an example of the second transparent conductive film layer, but the second transparent conductive film layer may be of any other transparent conductive material, which is not limited thereto. A material of the second transparent conductive oxide film layer 7 may be indium tin oxide, or may be indium zinc oxide, indium gallium zinc oxide, or a combination of above any ones, which is not limited thereto. Further, in the abovementioned array substrate provided by an embodiment of the present invention, the second transparent conductive oxide film layer 7 may be manufactured by using a magnetron sputtering process. Due to the limit to deposition time and etching precision, the thickness of the second transparent conductive oxide film layer 7 may be 30-50 nm. The following embodiments of the present invention are described by taking a case where the thickness of the first transparent conductive oxide film layer 7 is 40 nm as an example.

Hereinafter, three embodiments are used to detail specific implementation methods of the array substrates applied to liquid crystal display screens and provided by the embodiments of the present invention.

First Embodiment

An array substrate of the present embodiment is applied to a TN mode liquid crystal display screen, and a material of a first transparent conductive oxide film layer 2 is indium tin oxide.

The array substrate illustrated by FIG. 1 is taken as a comparison example, and the array substrate illustrated by FIG. 4 is taken as an embodiment. In an example, a refractive index of a base substrate is 1.5; a thickness of a first transparent conductive oxide film layer 2 is 40 nm, the refractive index of which is 1.92; a thickness of an insulating layer 3 is 680 nm, the refractive index of which is 1.7; a thickness of an alignment layer 4 is 80 nm, the refractive index of which is 1:7; a refractive index of a liquid crystal layer 5 is 1.53; and a thickness of a coating layer 8 varies in a range of 0-200 nm, the refractive index of which is 1.6, 1.7, 1.8, or 1.9.

Figure 6:
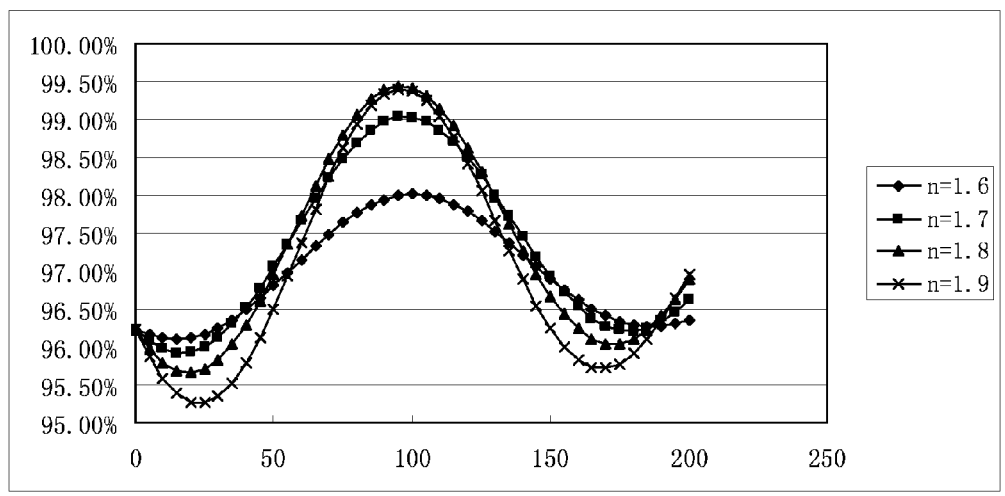
FIG. 6 to FIG. 8 separately are light transmission rate curve diagrams of array substrates of a first embodiment to a third embodiment of the present invention.

When incident light with a wavelength of 555 nm emitted from a light source perpendicularly enters from a side of the base substrate 1 of the array substrates of the comparison example and the present embodiment respectively, a light transmission rate of the array substrate in the comparison example is 96.2%, while a light transmission rate of the array substrate in the present embodiment changes along the changes of the thickness and the refractive index of the coating layer. As illustrated by FIG. 6, curves A, B, C, and D each are variation curves of the light transmission rate of the array substrate along the thickness of the coating layer 8 when the refractive index of the coating layer is 1.6, 1.7, 1.8, and 1.9.

It can seen from FIG. 6 that when the thickness of the coating layer 8 is within a range of 40-160 nm, the light transmission rate of the array substrate in the present embodiment is always bigger than that of the array substrate in the comparison example; besides, when the refractive index of the coating layer 8 is 1.8 and the thickness is 96 nm, the light transmission rate of the array substrate in the present embodiment can reach the maximum value of 99.4%. Therefore, the light transmission rate of the array substrate may be improved by newly adding the coating layer 8, with a specific refractive index and a specific thickness, between the base substrate 1 and the first transparent conductive oxide film layer 2 of the array substrate.

Second Embodiment

An array substrate of the present embodiment is applied to an ADS mode liquid crystal display screen, materials of a first transparent conductive oxide film layer 2 and a second transparent conductive oxide film layer 7 are indium tin oxide.

The array substrate illustrated by FIG. 2 is taken as a comparison example, and the array substrate illustrated by FIG. 5 is taken as an embodiment. In an example, a refractive index of a base substrate 1 is 1.5; both the thickness of the first transparent conductive oxide film layer 2 and the thickness of the second transparent conductive oxide film layer 7 are 40 nm, and their refractive indexes are 1.92; a thickness of an insulating layer 3 is 400 nm, the refractive index of which is 1.7; a thickness of a passivation layer 6 is 350 nm, the refractive index of which is 1.7; a thickness of an alignment layer 4 is 80 nm, the refractive index of which is 1.7; a refractive index of a liquid crystal layer 5 is 1.53; and a thickness of a coating layer 8 varies in a range of 0-200 nm, the refractive index of which is 1.6, 1.7, 1.8, or 1.9.

Figure 7:
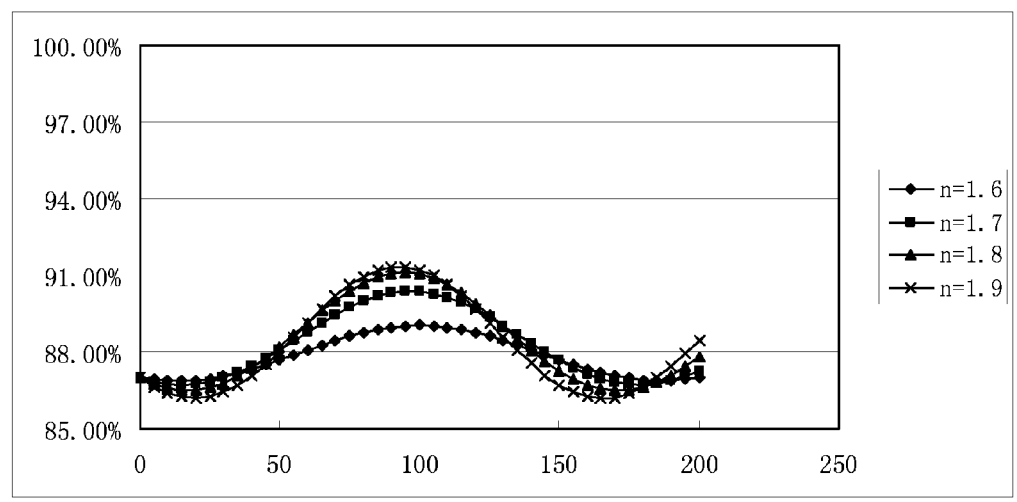

When incident light with a wavelength of 555 nm emitted from a light source perpendicularly enters from a side of the base substrate of the array substrates of the comparison example and the present embodiment respectively, a light transmission rate of the array substrate in the comparison example is 87%, while a light transmission rate of the array substrate in the present embodiment changes along the changes of the thickness and the refractive index of the coating layer. As illustrated by FIG. 7, curves A, B, C, and D each are variation curves of the light transmission rate of the array substrate along the thickness of the coating layer 8 when the refractive index of the coating layer is 1.6, 1.7, 1.8, and 1.9.

It can seen from FIG. 7 that when the thickness of the coating layer 8 is within a range of 40-160 nm, the light transmission rate of the array substrate in the present embodiment is always bigger than that of the array substrate in the comparison example; besides, when the refractive index of the coating layer 8 is 1.9 and the thickness is 92 nm, the light transmission rate of the array substrate in the present embodiment can reach the maximum value of 91.2%. Therefore, the light transmission rate of the array substrate may be improved by newly adding the coating layer 8, with a specific refractive index and a specific thickness, between the base substrate 1 and the first transparent conductive oxide film layer 2 of the array substrate.

Third Embodiment

An array substrate of the present embodiment is applied to an ADS mode liquid crystal display screen, and materials of a first transparent conductive oxide film layer 2 and a second transparent conductive oxide film layer 7 are indium zinc oxide or indium gallium zinc oxide.

The array substrate illustrated by FIG. 1 is taken as a comparison example, and the array substrate illustrated by FIG. 4 is taken as an embodiment. In an example, a refractive index of a base substrate is 1.5; both the thickness of the first transparent conductive oxide film layer 2 and the thickness of the second transparent conductive oxide film layer 7 are 40 nm, and their refractive indexes are 2.05; a thickness of an insulating layer 3 is 400 nm, the refractive index of which is 1.7; a thickness of a passivation layer 6 is 350 nm, the refractive index of which is 1.7; a thickness of an alignment layer 4 is 80 nm, the refractive index of which is 1.7; a refractive index of a liquid crystal layer 5 is 1.53; and a thickness of a coating layer 8 varies in a range of 0-200 nm, the refractive index of which is 1.6, 1.7, 1.8, or 1.9.

Figure 8:
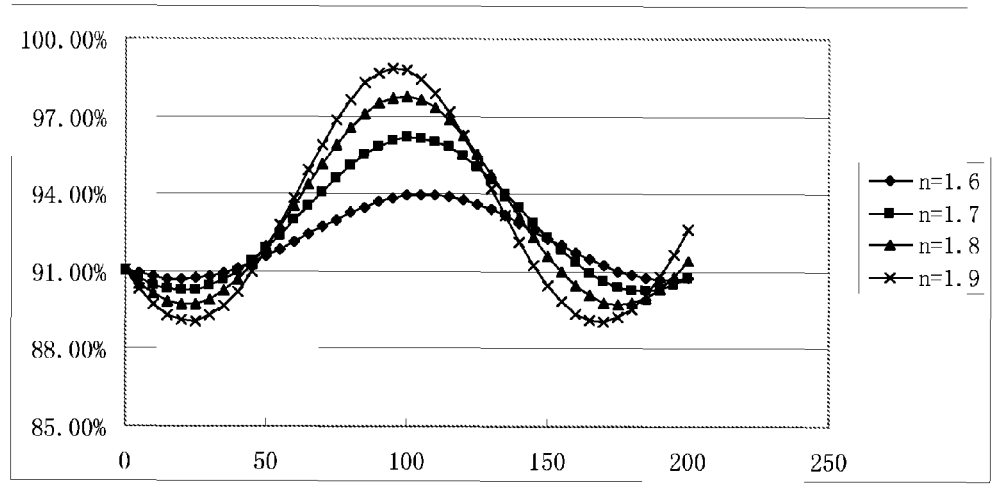

When incident light with a wavelength of 555 nm emitted from a light source perpendicularly enters from a side of the base substrate of the array substrates of the comparison example and the present embodiment respectively, a light transmission rate of the array substrate in the comparison example is 91.1%, while a light transmission rate of the array substrate in the present embodiment changes along the changes of the thickness and the refractive index of the coating layer. As illustrated by FIG. 8, curves A, B, C, and D each are variation curves of the light transmission rate of the array substrate along the thickness of the coating layer 8 when the refractive index of the coating layer is 1.6, 1.7, 1.8, and 1.9 respectively.

It can seen from FIG. 8 that when the thickness of the coating layer 8 is a range of 40-160 nm, the light transmission rate of the array substrate in the present embodiment is always bigger than that of the array substrate in the comparison example; besides, when the refractive index of the coating layer 8 is 1.9 and the thickness is 98 nm, the light transmission rate of the array substrate in the present embodiment can reach the maximum value of 98.5%. Therefore, the light transmission rate of the array substrate may be improved by newly adding the coating layer 8, with a specific refractive index and a specific thickness, between the base substrate 1 and the first transparent conductive oxide film layer 2 of the array substrate.

Besides, in comparison of the second embodiment and the third embodiment, it can be seen that the array substrate obtained by using indium zinc oxide or indium gallium zinc oxide to manufacture the first transparent conductive oxide film layer 2 and the second transparent conductive oxide film layer 7 has a higher light transmission rate than the array substrate obtained by using indium tin oxide.

Based on the same inventive concept, at least one embodiment of the present invention further provides a display device, comprising the abovementioned array substrate provided by an embodiment of the present invention; the array substrate may be a liquid crystal display (LCD) array substrate, may also be an organic light emitting diode (OLED) array substrate, or the other array substrates in which a transparent conductive film layer is disposed on a base substrate. The display device may be, for example, a cell phone, a tablet computer, a television, a display, a notebook computer, a digital photo frame, a navigating instrument, and any other products or components having a display function. The implementation method of the display device may refer to the embodiments of the abovementioned array substrate, and is not further described.

Figure 9:
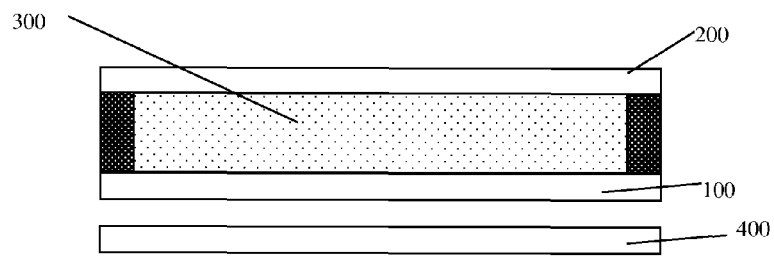
FIG. 9 is a structural schematic diagram of a display device provided by an embodiment of the present invention.

For example, when an array substrate contained by the above-mentioned display device provided by an embodiment of the present invention is a liquid crystal display array substrate 100, the above-mentioned display device may further comprise an opposed substrate 200 disposed opposite to the above-mentioned array substrate provided by an embodiment of the present invention, a liquid crystal layer 300 located between the opposed substrate and the above-mentioned array substrate, and a backlight source 400 located at another side of the array substrate 100, as illustrated by FIG. 9.

In an array substrate and a display device provided by at least one embodiment of the present invention, a coating layer 8 is newly added between a base substrate and a first transparent conductive oxide film layer which have a relatively big difference between the refractive indexes, and the refractive index of the coating layer 8 is bigger than that of the base substrate while smaller than that of the first transparent conductive oxide film layer; so a multi-layer reflection phenomenon caused by the relatively big difference between the refractive indexes of the base substrate and the first transparent conductive oxide film layer can be weakened, thereby the light transmission rate of the array substrate may be improved.

It is apparent that persons skilled in the art can make various modifications and variations to the present invention without departing the spirit and scope. Thus, the present invention is intended to encompass such modifications and variations provided that these modifications and variations fall with the scope as defined by the appended claims or its equivalence.

The present application claims a priority of a Chinese patent application with the application number of 201310745888.7, submitted on Dec. 30, 2013; the Chinese patent application is entirely incorporated herein by reference as a part of the present application.

The invention claimed is:

1. An array substrate, comprising a base substrate, a first transparent conductive film layer located on the base substrate, and a coating layer disposed between the base substrate and the first transparent conductive film layer,
   wherein a refractive index of the coating layer is bigger than that of the base substrate and smaller than that of the first transparent conductive film layer; and
   wherein a material of the coating layer comprises one or a combination of any ones selected from a group consisting of yttrium oxide, cerium fluoride, and scandium oxide.

2. The array substrate according to claim 1, wherein a refractive index of the coating layer comprises 1.6, 1.7, 1.8, or 1.9.

3. The array substrate according to claim 1, wherein a thickness of the coating layer is bigger than or equal to 40 nm and smaller than or equal to 160 nm.

4. The array substrate according to claim 1, further comprising: a second transparent conductive film layer located on the first transparent conductive film layer and insulated from the first transparent conductive film layer.

5. The array substrate according to claim 4, wherein a material of the second transparent conductive film layer comprises a transparent conductive oxide.

6. The array substrate according to claim 5, wherein the transparent conductive oxide comprises one or a combination of any ones selected from a group consisting of indium tin oxide, indium zinc oxide, and indium gallium zinc oxide.

7. A display device, comprising the array substrate according to claim 1.

8. The display device according to claim 7, further comprising: an opposed substrate disposed opposite to the array substrate and a liquid crystal layer located between the opposed substrate and the array substrate.

9. The array substrate according to claim 2, further comprising: a second transparent conductive film layer located on the first transparent conductive film layer and insulated from the first transparent conductive film layer.

10. The array substrate according to claim 9, wherein a material of the second transparent conductive film layer comprises a transparent conductive oxide.

11. The array substrate according to claim 10, wherein the transparent conductive oxide comprises one or a combination of any ones selected from a group consisting of indium tin oxide, indium zinc oxide, and indium gallium zinc oxide.

12. The array substrate according to claim 1, wherein a material of the first transparent conductive film layer comprises a transparent conductive oxide.

13. The array substrate according to claim 12, wherein the transparent conductive oxide comprises one or a combination of any ones selected from a group consisting of indium tin oxide, indium zinc oxide, and indium gallium zinc oxide.

14. The array substrate according to claim 12, wherein a thickness of the coating layer is bigger than or equal to 40 nm and smaller than or equal to 160 nm.

15. The array substrate according to claim 12, further comprising: a second transparent conductive film layer located on the first transparent conductive film layer and insulated from the first transparent conductive film layer.

16. The array substrate according to claim 15, wherein a material of the second transparent conductive film layer comprises a transparent conductive oxide.

17. The array substrate according to claim 1, wherein the transparent conductive oxide comprises one or a combination of any ones selected from a group consisting of indium tin oxide, indium zinc oxide, and indium gallium zinc oxide.

18. The array substrate according to claim 12, wherein a refractive index of the coating layer comprises 1.6, 1.7, 1.8, or 1.9.

19. The array substrate according to claim 13, wherein a refractive index of the coating layer comprises 1.6, 1.7, 1.8, or 1.9.

* * * * *